US012615923B2

(12) United States Patent
Kim et al.

(10) Patent No.: US 12,615,923 B2
(45) Date of Patent: Apr. 28, 2026

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventors: Hun Kim, Yongin-si (KR); Hyo-Jeong Kwon, Yongin-si (KR); Moon-Won Chang, Yongin-si (KR); Won-Kyu Choe, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 235 days.

(21) Appl. No.: 17/144,388

(22) Filed: Jan. 8, 2021

(65) Prior Publication Data

US 2021/0134914 A1 May 6, 2021

Related U.S. Application Data

(62) Division of application No. 14/584,380, filed on Dec. 29, 2014, now Pat. No. 10,910,456.

(30) Foreign Application Priority Data

May 28, 2014 (KR) ........................ 10-2014-0064567

(51) Int. Cl.
| | |
|---|---|
| *H01L 27/32* | (2006.01) |
| *H10D 86/40* | (2025.01) |
| *H10D 86/60* | (2025.01) |
| *H10K 59/124* | (2023.01) |

| | |
|---|---|
| *H10K 59/123* | (2023.01) |
| *H10K 102/00* | (2023.01) |

(52) U.S. Cl.
CPC ......... *H10K 59/124* (2023.02); *H10D 86/451* (2025.01); *H10D 86/60* (2025.01); *H10K 59/123* (2023.02); *H10K 2102/341* (2023.02)

(58) Field of Classification Search
CPC ......... H01L 2251/5392; H01L 27/3258; H01L 27/1248; H01L 27/3248; H10K 59/124; H10K 59/123; H10K 2102/341; H10D 86/451; H10D 86/60
See application file for complete search history.

(56) References Cited

U.S. PATENT DOCUMENTS

| | | | |
|---|---|---|---|
| 4,821,092 | A | 4/1989 | Noguchi |
| 5,003,356 | A | 3/1991 | Wakai et al. |
| 5,208,690 | A | 5/1993 | Hayashi et al. |
| 5,550,066 | A | 8/1996 | Tang et al. |

(Continued)

FOREIGN PATENT DOCUMENTS

| | | |
|---|---|---|
| JP | 2013-243094 | 12/2013 |
| KR | 10-2005-0051500 | 6/2005 |

(Continued)

*Primary Examiner* — Jay C Kim
(74) *Attorney, Agent, or Firm* — Innovation Counsel LLP

(57) ABSTRACT

An organic light-emitting display apparatus includes a transistor on a substrate. The transistor includes a gate electrode, a first electrode, and a second electrode. The apparatus also includes a protective layer over the first electrode and including a first portion that contacts the second electrode, and an organic light-emitting device having a pixel electrode electrically connected to the second electrode.

20 Claims, 3 Drawing Sheets

(56) References Cited

U.S. PATENT DOCUMENTS

| | | | |
|---|---|---|---|
| 5,585,951 A | 12/1996 | Noda et al. | |
| 5,684,365 A | 11/1997 | Tang et al. | |
| 5,696,386 A * | 12/1997 | Yamazaki | H01L 27/1214 |
| | | | 257/59 |
| 5,811,836 A | 9/1998 | Ha | |
| 5,994,157 A | 11/1999 | Aggas et al. | |
| 6,031,512 A | 2/2000 | Kadota et al. | |
| 6,100,954 A | 8/2000 | Kim et al. | |
| 6,114,184 A | 9/2000 | Matsumoto et al. | |
| 6,136,624 A | 10/2000 | Kemmochi et al. | |
| 6,147,451 A | 11/2000 | Shibata et al. | |
| 6,163,357 A | 12/2000 | Nakamura | |
| 6,219,114 B1 | 4/2001 | Lyu | |
| 6,320,224 B1 | 11/2001 | Zhang | |
| 6,330,044 B1 | 12/2001 | Murade | |
| 6,380,006 B2 | 4/2002 | Kido | |
| 6,433,851 B2 | 8/2002 | Shimada et al. | |
| 6,501,098 B2 * | 12/2002 | Yamazaki | G02F 1/1368 |
| | | | 257/E29.279 |
| 6,538,374 B2 | 3/2003 | Hosokawa | |
| 6,569,717 B1 * | 5/2003 | Murade | H10D 30/0321 |
| | | | 438/149 |
| 6,599,783 B2 | 7/2003 | Takatoku | |
| 6,608,449 B2 | 8/2003 | Fukunaga | |
| 6,614,174 B1 | 9/2003 | Urabe et al. | |
| 6,674,136 B1 * | 1/2004 | Ohtani | H10D 86/0221 |
| | | | 257/E21.415 |
| 6,717,359 B2 | 4/2004 | Kimura | |
| 6,758,538 B2 * | 7/2004 | Fujita | H01J 1/70 |
| | | | 313/499 |
| 6,762,803 B1 | 7/2004 | Koide | |
| 6,822,264 B2 * | 11/2004 | Yamazaki | H01L 27/124 |
| | | | 438/30 |
| 6,893,887 B2 | 5/2005 | Yamagata et al. | |
| 6,905,907 B2 | 6/2005 | Konuma | |
| 6,911,774 B2 | 6/2005 | Arakawa et al. | |
| 6,960,786 B2 | 11/2005 | Yamazaki et al. | |
| 6,972,517 B2 * | 12/2005 | Park | H10K 59/131 |
| | | | 313/506 |
| 7,132,375 B2 * | 11/2006 | Yamazaki | H10D 86/0227 |
| | | | 257/E27.111 |
| 7,211,828 B2 | 5/2007 | Yamazaki et al. | |
| 7,236,220 B2 | 6/2007 | Kim et al. | |
| 7,265,384 B2 | 9/2007 | Oh | |
| 7,279,715 B2 | 10/2007 | Park et al. | |
| 7,291,970 B2 | 11/2007 | Kuwabara | |
| 7,291,973 B2 * | 11/2007 | Ishihara | H10K 50/85 |
| | | | 313/506 |
| 7,339,317 B2 | 3/2008 | Yamazaki | |
| 7,391,493 B2 | 6/2008 | Kim | |
| 7,453,198 B2 * | 11/2008 | Kang | H10K 71/233 |
| | | | 313/498 |
| 7,486,016 B2 * | 2/2009 | Lee | H10K 59/124 |
| | | | 313/506 |
| 7,488,986 B2 | 2/2009 | Yamazaki et al. | |
| 7,505,098 B2 | 3/2009 | Nakamura et al. | |
| 7,528,019 B2 * | 5/2009 | Lee | H01L 29/66765 |
| | | | 438/149 |
| 7,531,834 B2 | 5/2009 | Lee et al. | |
| 7,550,774 B2 | 6/2009 | Inoue et al. | |
| 7,586,123 B2 | 9/2009 | Choi et al. | |
| 7,586,555 B2 | 9/2009 | Lee | |
| 7,641,531 B2 * | 1/2010 | Yamazaki | H10K 71/00 |
| | | | 445/24 |
| 7,646,143 B2 | 1/2010 | Kimura | |
| 7,648,865 B1 | 1/2010 | Yang et al. | |
| 7,663,310 B2 | 2/2010 | Lee et al. | |
| 7,691,685 B2 * | 4/2010 | Maekawa | H01L 21/76838 |
| | | | 257/E21.32 |
| 7,728,510 B2 * | 6/2010 | Oh | H10K 59/131 |
| | | | 313/499 |
| 7,803,029 B2 * | 9/2010 | Park | H10K 71/00 |
| | | | 313/506 |
| 7,816,159 B2 | 10/2010 | Fang et al. | |
| 7,846,784 B2 | 12/2010 | Kim et al. | |
| 7,859,606 B2 | 12/2010 | Higaki et al. | |
| 7,868,957 B2 * | 1/2011 | Yamazaki | H01L 29/78678 |
| | | | 438/158 |
| 7,902,747 B2 * | 3/2011 | Yamazaki | H10K 50/81 |
| | | | 313/506 |
| 7,906,779 B2 * | 3/2011 | Yamayoshi | H10D 30/0321 |
| | | | 257/69 |
| 7,977,867 B2 * | 7/2011 | Yamazaki | H10K 59/126 |
| | | | 313/504 |
| 7,994,496 B2 * | 8/2011 | Saito | H10K 50/81 |
| | | | 257/40 |
| 8,004,184 B2 | 8/2011 | Han et al. | |
| 8,012,529 B2 * | 9/2011 | Sakata | H10K 50/17 |
| | | | 427/535 |
| 8,040,059 B2 | 10/2011 | Imai et al. | |
| 8,053,981 B2 | 11/2011 | Chan et al. | |
| 8,062,695 B2 | 11/2011 | Matsuda | |
| 8,093,585 B2 | 1/2012 | Nishimura et al. | |
| 8,106,402 B2 * | 1/2012 | Yeo | H01L 29/4908 |
| | | | 438/34 |
| 8,133,748 B2 * | 3/2012 | Yamazaki | H10K 71/135 |
| | | | 438/28 |
| 8,183,099 B2 | 5/2012 | Sakata | |
| 8,203,264 B2 * | 6/2012 | Kang | H01L 27/124 |
| | | | 313/500 |
| 8,228,453 B2 * | 7/2012 | Yamazaki | H01L 29/66765 |
| | | | 349/46 |
| 8,237,358 B2 | 8/2012 | Pang | |
| 8,294,154 B2 * | 10/2012 | Yamazaki | H10K 59/131 |
| | | | 257/E33.062 |
| 8,344,362 B2 | 1/2013 | Kitabayashi et al. | |
| 8,350,466 B2 * | 1/2013 | Murakami | H10K 50/84 |
| | | | 313/506 |
| 8,421,337 B2 | 4/2013 | Suh et al. | |
| 8,426,861 B2 * | 4/2013 | Choi | H10K 59/124 |
| | | | 257/59 |
| 8,441,178 B2 | 5/2013 | Choi | |
| 8,445,915 B2 | 5/2013 | You | |
| 8,461,593 B2 * | 6/2013 | Park | H10K 59/123 |
| | | | 438/149 |
| 8,487,310 B2 | 7/2013 | Kang et al. | |
| 8,487,395 B2 | 7/2013 | Kanegae et al. | |
| 8,507,928 B2 | 8/2013 | Uchida | |
| 8,519,385 B2 | 8/2013 | Lim et al. | |
| 8,569,950 B2 | 10/2013 | Joo et al. | |
| 8,593,059 B2 | 11/2013 | Tanaka et al. | |
| 8,598,581 B2 | 12/2013 | Kim et al. | |
| 8,604,688 B2 * | 12/2013 | Shin | H10K 59/80518 |
| | | | 313/506 |
| 8,624,290 B2 | 1/2014 | Hirai | |
| 8,629,960 B2 | 1/2014 | Moriwaki | |
| 8,674,366 B2 | 3/2014 | Suzawa et al. | |
| 8,698,147 B2 * | 4/2014 | Choi | H01L 27/1214 |
| | | | 257/59 |
| 8,704,236 B2 | 4/2014 | You et al. | |
| 8,785,937 B2 | 7/2014 | Lee et al. | |
| 8,822,982 B2 | 9/2014 | Yamazaki et al. | |
| 8,822,999 B2 * | 9/2014 | Choi | H01L 29/4908 |
| | | | 438/149 |
| 8,841,670 B2 * | 9/2014 | Jin | H01L 51/0005 |
| | | | 438/34 |
| 8,860,303 B2 * | 10/2014 | Kim | H10K 59/127 |
| | | | 313/506 |
| 8,940,613 B2 * | 1/2015 | An | H01L 27/3265 |
| | | | 257/532 |
| 8,994,007 B2 * | 3/2015 | Saito | H10K 50/844 |
| | | | 257/40 |
| 9,046,955 B1 | 6/2015 | Lee et al. | |
| 9,054,230 B2 | 6/2015 | Sakakura et al. | |
| 9,070,896 B2 | 6/2015 | Kim et al. | |
| 9,099,409 B2 | 8/2015 | Fujita | |
| 9,105,529 B2 * | 8/2015 | Kim | H01L 21/283 |
| 9,153,605 B2 | 10/2015 | Kim et al. | |
| 9,190,457 B2 | 11/2015 | Im et al. | |
| 9,196,664 B2 | 11/2015 | Kim et al. | |

(56)                References Cited

U.S. PATENT DOCUMENTS

|  |  |  |  |  |
|---|---|---|---|---|
| 9,209,311 | B2 * | 12/2015 | Ueda ....................... | B82Y 10/00 |
| 9,214,504 | B2 | 12/2015 | Sato | |
| 9,287,299 | B2 | 3/2016 | Kim et al. | |
| 9,331,134 | B2 | 5/2016 | Tokuda et al. | |
| 9,349,780 | B2 | 5/2016 | Kim et al. | |
| 9,366,930 | B2 | 6/2016 | Yamazaki et al. | |
| 9,444,069 | B2 | 9/2016 | Murakami et al. | |
| 9,502,484 | B2 | 11/2016 | Lee | |
| 9,767,693 | B2 | 9/2017 | Lee et al. | |
| 9,857,867 | B2 | 1/2018 | Kumar et al. | |
| 10,680,044 | B2 * | 6/2020 | Go ......................... | H01L 51/525 |
| 2004/0263072 | A1 | 12/2004 | Park et al. | |
| 2005/0116231 | A1 | 6/2005 | Kang et al. | |
| 2006/0001091 | A1 | 1/2006 | Kim | |
| 2006/0113900 | A1 | 6/2006 | Oh | |
| 2006/0125390 | A1 | 6/2006 | Oh | |
| 2007/0072439 | A1 | 3/2007 | Akimoto et al. | |
| 2009/0195148 | A1 | 8/2009 | Lee et al. | |
| 2010/0007271 | A1 | 1/2010 | Lee et al. | |
| 2011/0069036 | A1 | 3/2011 | Anno | |
| 2012/0075243 | A1 | 3/2012 | Doi et al. | |
| 2012/0097952 | A1 | 4/2012 | Kang et al. | |
| 2012/0097953 | A1 * | 4/2012 | Park ....................... | H01L 27/124 |
| | | | | 438/34 |
| 2012/0168758 | A1 * | 7/2012 | Jin ....................... | H01L 51/0005 |
| | | | | 438/34 |
| 2013/0313547 | A1 | 11/2013 | Nakano et al. | |
| 2014/0042394 | A1 | 2/2014 | Lee | |
| 2014/0111842 | A1 | 4/2014 | Mao et al. | |
| 2015/0179812 | A1 | 6/2015 | Suzumura et al. | |
| 2016/0204139 | A1 * | 7/2016 | Kishida .............. | H01L 27/1255 |
| | | | | 257/43 |

FOREIGN PATENT DOCUMENTS

| KR | 10-0611151 | 8/2006 |
|---|---|---|
| KR | 10-0667089 | 1/2007 |
| KR | 10-2007-0043550 | 4/2007 |
| KR | 10-2008-0086201 | 9/2008 |
| KR | 10-2009-0099745 | 9/2009 |
| KR | 10-2010-0062566 | 6/2010 |
| KR | 10-2012-0034409 | 4/2012 |
| KR | 10-2013-0075141 | 7/2013 |
| WO | 2012/142847 | 10/2012 |

* cited by examiner

FIG. 5

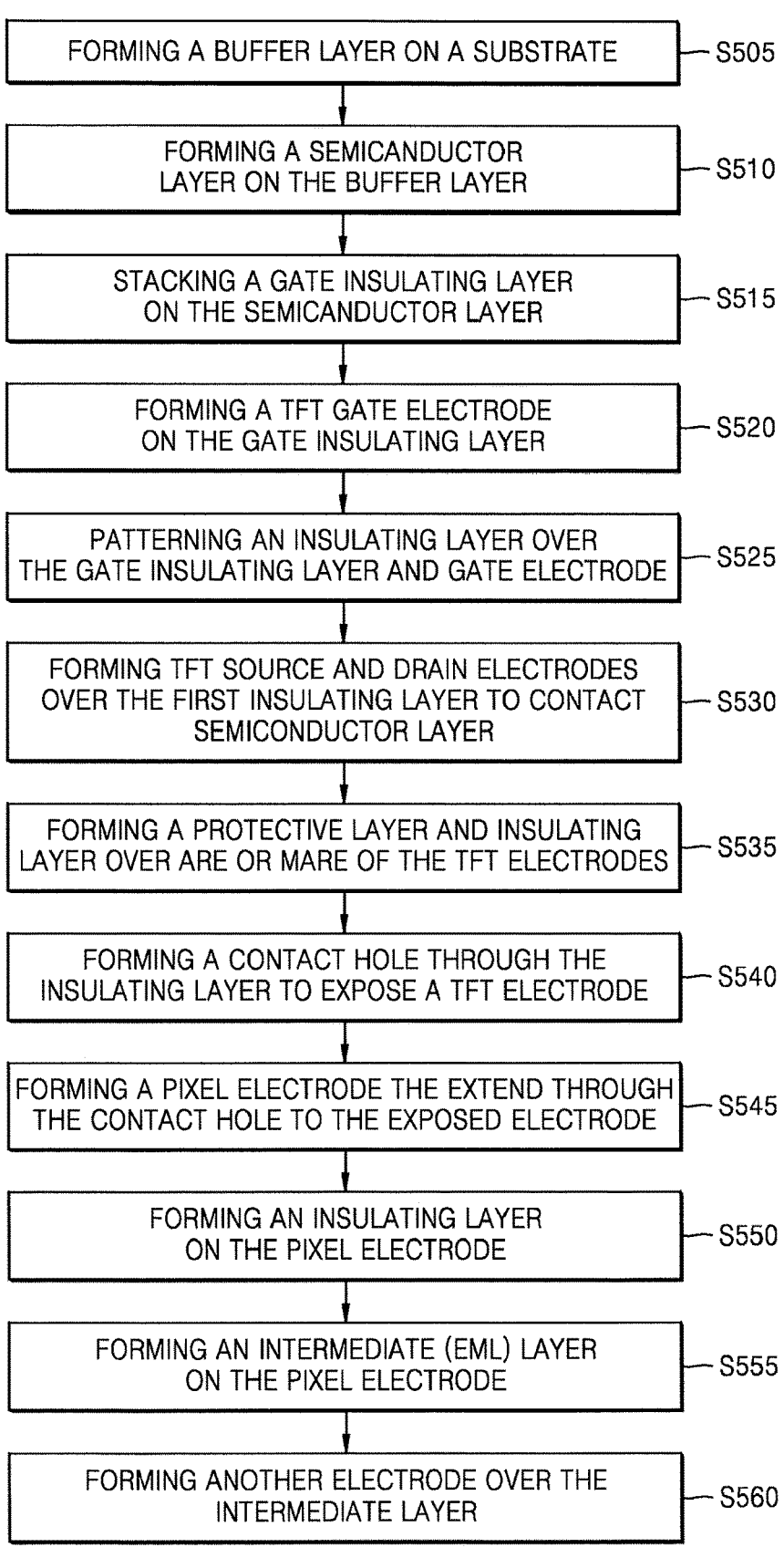

FORMING A BUFFER LAYER ON A SUBSTRATE — S505

FORMING A SEMICANDUCTOR LAYER ON THE BUFFER LAYER — S510

STACKING A GATE INSULATING LAYER ON THE SEMICANDUCTOR LAYER — S515

FORMING A TFT GATE ELECTRODE ON THE GATE INSULATING LAYER — S520

PATTERNING AN INSULATING LAYER OVER THE GATE INSULATING LAYER AND GATE ELECTRODE — S525

FORMING TFT SOURCE AND DRAIN ELECTRODES OVER THE FIRST INSULATING LAYER TO CONTACT SEMICONDUCTOR LAYER — S530

FORMING A PROTECTIVE LAYER AND INSULATING LAYER OVER ARE OR MARE OF THE TFT ELECTRODES — S535

FORMING A CONTACT HOLE THROUGH THE INSULATING LAYER TO EXPOSE A TFT ELECTRODE — S540

FORMING A PIXEL ELECTRODE THE EXTEND THROUGH THE CONTACT HOLE TO THE EXPOSED ELECTRODE — S545

FORMING AN INSULATING LAYER ON THE PIXEL ELECTRODE — S550

FORMING AN INTERMEDIATE (EML) LAYER ON THE PIXEL ELECTRODE — S555

FORMING ANOTHER ELECTRODE OVER THE INTERMEDIATE LAYER — S560

ORGANIC LIGHT-EMITTING DISPLAY APPARATUS AND METHOD OF MANUFACTURING THE SAME

CROSS-REFERENCE TO RELATED APPLICATION(S)

This is a continuation application of U.S. patent application Ser. No. 14/584,380 filed Dec. 29, 2014 (now U.S. Pat. No. 10,910,456), the disclosure of which is incorporated herein by reference in its entirety. U.S. patent application Ser. No. 14/584,380 claims priority benefit of Korean Patent Application 10-2014-0064567 filed May 28, 2014, in the Korean Intellectual Property Office, the disclosure of which is incorporated herein by reference in its entirety for all purposes.

BACKGROUND

1. Field

One or more embodiments described herein relate to an organic light-emitting display apparatus and a method of manufacturing an organic light-emitting apparatus.

2. Description of the Related Art

An organic light-emitting display has a wide viewing angle, good contrast, and fast response time, and therefore have been used in portable electronic terminals and televisions. Structurally, an organic light-emitting display includes a plurality of organic light-emitting devices formed on a lower substrate bonded to an upper substrate. Each light-emitting device includes an including an emission layer between opposing electrodes. At least one organic light-emitting device is provided for each pixel. The degree of light emission from each pixels is controlled by a thin film transistor (TFT), which is electrically connected to one of the electrodes. The emission layer emits light based on an electrical signal between the electrodes.

When an electrode of an organic light-emitting device contacts at least one electrode of the TFT, a dark spot or bright spot may occur. The dark or bright spot may occur when a foreign material penetrates into one of the electrodes of the light-emitting device. When this happens, the quality of the display is adversely affected.

SUMMARY

In accordance with one embodiment, an organic light-emitting display apparatus includes a substrate; a transistor on the substrate and including a gate electrode, a first electrode, and a second electrode; a protective layer over the first electrode and including a first portion that contacts the second electrode; and an organic light-emitting device having a pixel electrode electrically connected to the second electrode. The apparatus may include an insulating layer between the gate electrode and the first and second electrodes, wherein a second portion of the protective layer contacts the insulating layer. The protective layer may not be disposed in a region where the transistor is not disposed. The protective layer may include an inorganic material.

In accordance with another embodiment, an organic light-emitting display apparatus includes a substrate; a transistor on the substrate and including a gate electrode, a first electrode, and a second electrode; a first insulating layer between the gate electrode and the first and second electrodes; a first protective layer on the first insulating layer on the gate electrode, a first portion the protective layer contacting the first electrode and a second portion of the protective layer contacting the second electrode; an organic light-emitting device having a pixel electrode electrically connected to the second electrode; a second insulating layer between the transistor and the pixel electrode; and a second protective layer between the second insulating layer and the pixel electrode. The second protective layer may be on the first electrode. Each of the first and second protective layers may include an inorganic material.

In accordance with another embodiment, a method of manufacturing an organic light-emitting display apparatus includes forming a transistor on a substrate, the transistor including a gate electrode, a first electrode, and a second electrode; forming a protective layer on the first electrode, the protective layer including a first portion contacting the second electrode; and forming an organic light-emitting device having a pixel electrode electrically connected to the second electrode. The method may include forming an insulating layer between the gate electrode and the first and second electrodes. The protective layer may not be disposed in a region where the transistor is not disposed. The protective layer may include an inorganic material.

In accordance with another embodiment, a pixel includes a transistor; a light emitter separated from the transistor by a space; and at least one protective layer between the transistor and the light emitter, wherein the at least one protective layer includes a non-conductive material which contacts an electrode of the light emitter when the electrode of the light emitter moves into the space by a force, and wherein the contact between the at least one protective layer and the electrode of the light emitter blocks an electrode of the transistor from being electrically connected to the electrode of the light emitter.

The at least one protective layer may be over a predetermined number of electrodes of the transistor, and wherein the predetermined number may be less than three. A portion of the at least one protective layer may extend between source and drain electrodes of the transistor. The space may include an insulating layer which deforms when the electrode of the light emitter moves into the space. The at least one protective layer may include an inorganic material. The pixel may include a planarizing layer over the transistor and at least one protective layer.

The at least one protective layer may include a first protective layer between source and drain electrodes of the transistor, and a second protective layer spaced from the first protective layer over the transistor. The pixel may include an insulating layer between the first and second protective layers. The second protective layer may be between the first protective layer and the electrode of the light emitter.

BRIEF DESCRIPTION OF THE DRAWINGS

Features will become apparent to those of skill in the art by describing in detail exemplary embodiments with reference to the attached drawings in which:

FIG. 5 illustrates an embodiment of a method for manufacturing an organic light-emitting display.

DETAILED DESCRIPTION

Figure 1:
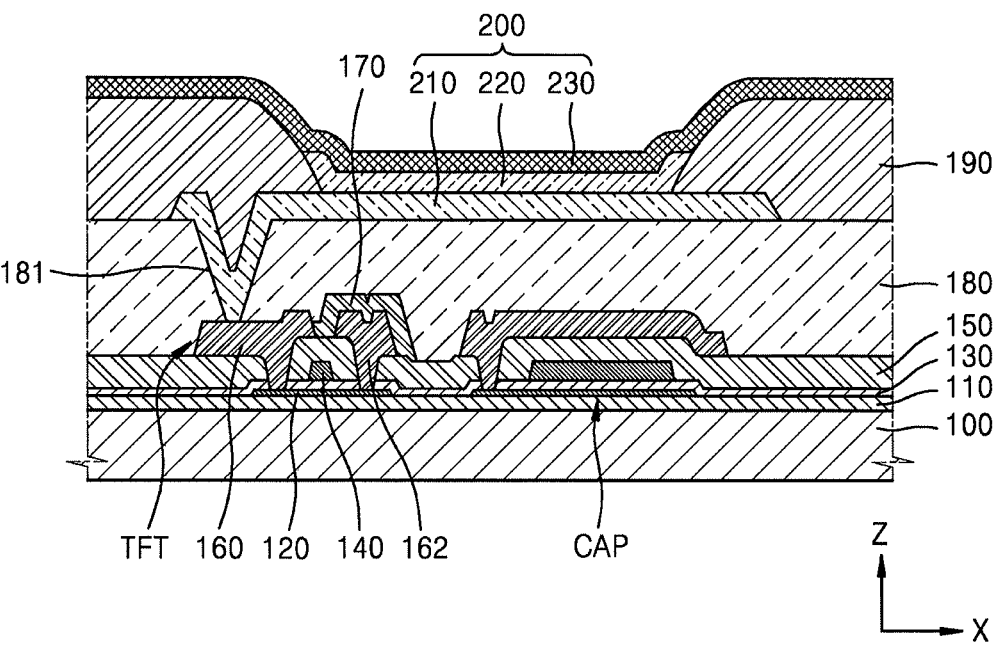
FIG. 1 illustrates an embodiment of an organic light-emitting display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 is a cross-sectional view of one embodiment of an organic light-emitting display apparatus which includes a substrate 100, a thin film transistor (TFT) on the substrate 100, a first protective layer 170, and an organic light-emitting device 200. The substrate 100, the transistor TFT, the first protective layer 170, and the organic light-emitting device 200 may all correspond to a pixel, which may be a unit pixel or sub-pixel. A capacitor CAP is electrically connected to the transistor TFT. The capacitor may store a voltage corresponding, for example, to a gray scale value of light to be emitted from the pixel or sub-pixel.

The substrate 100 may be formed of various materials such as a glass material, a metal material, and/or a plastic material such as polyethylene terephthalate (PET), polyethylene naphthalate (PEN), or polyimide. The substrate 100 includes a display region in which a plurality of pixels are arranged, and a peripheral region adjacent to or which surrounds the display region.

The organic light-emitting device 200 is electrically connected to the TFT and is disposed on the substrate 100. The organic light-emitting device 200 may include a pixel electrode 210 that is electrically connected to the TFT.

The TFT includes a semiconductor layer 120, a gate electrode 140, a first electrode 162, and a second electrode 160. The semiconductor layer 120 include an amorphous silicon, polycrystalline silicon, an organic semiconductor material, or another material. The first electrode 162 may correspond to a source electrode and the second electrode 160 may correspond to a drain electrode of the TFT.

In order to planarize a surface of the substrate 100, and/or to prevent impurities from penetrating into the semiconductor layer 120, a buffer layer 110 formed of silicon oxide or silicon nitride may be disposed on the substrate 100. The semiconductor layer 120 may be disposed on the buffer layer 110.

The gate electrode 140 may be on the semiconductor layer 120, and the first electrode 162 may be electrically connected to the second electrode 160 based on a signal applied to the gate electrode 140. The gate electrode 140 may be formed as a single layer or multiple layers, which may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The material of the gate electrode 140 may be determined, for example, by taking into consideration the adhesiveness of an adjacent layer, the surface flatness of a stacked layer, and/or processability. In one embodiment, a gate insulating layer 130, formed, for example, of silicon oxide and/or silicon nitride, may be disposed between the semiconductor layer 120 and the gate electrode 140 in order to insulate the semiconductor layer 120 from the gate electrode 140.

A first insulating layer 150 may be on the gate electrode 140, and may serve as an interlayer insulating layer between the gate electrode 140 and the first and second electrodes 162 and 160. The first insulating layer 150 may be formed as a single layer or multiple layers, which, for example, include as silicon oxide, silicon nitride, and/or a another material.

The first electrode 162 and the second electrode 160 may be on the first insulating layer 150. The first electrode 162 may be electrically connected to the second electrode 160 through a contact hole in the first insulating layer 150 and the gate insulating layer 130. Each of the first electrode 162 and the second electrode 160 may be a single layer or multiple layers, which, for example, include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The material to be used may be determined, for example, based on conductivity.

As illustrated in FIG. 1, the first protective layer 170 covers the first electrode 162 of the TFT. In this case, at least one portion of one end of the first protective layer 170 contacts the second electrode 160, e.g., the first protective layer 170 covers the first electrode 162 (corresponding to the source electrode and/or a data line) of the TFT and is not disposed over the second electrode 160 (which corresponds to the drain electrode). Further, the first protective layer 170 may contact the first insulating layer 150, in which the TFT is not disposed. The first protective layer 170 may include, for example, an inorganic material such as silicon oxide, silicon nitride, or silicon oxynitride.

Referring to the cross-sectional view of FIG. 1, the first protective layer 170 extends in a space between the first electrode 162 (corresponding to the data line) and second electrode 160 (electrically connected to the pixel electrode 210) of the TFT. The first protective layer 170 may therefore prevent a short circuit from forming between the first electrode 162 and second electrode 160 of the TFT.

Because the first protective layer 170 covers a top surface of the first electrode 162 of the TFT, a short circuit is prevented from occurring if a force pushes the pixel electrode 210 downwardly towards the first electrode 162. This force may be created, for example, by foreign material D (see FIGS. 2 and 3) penetrating into the device. In one embodiment, the first protective layer 170 is formed of a non-conductive (e.g., inorganic or organic) material. Because organic material may be expensive, the first protective layer 170 may be formed of an inorganic material in some applications. The inorganic material may be disposed, for example, to within a predetermined or minimum range of thickness to reduce manufacturing costs.

A second insulating layer 180 may be formed on the first protective layer 170, in a space between the transistor and the pixel electrode 210. The second insulating layer 180 may serve as a planarizing and/or as an additional protective layer. For example, when the organic light-emitting device 200 is formed over the TFT, as in FIG. 1, the second insulating layer 180 may serve as a planarizing layer that planarizes a top surface over the TFT. The second insulating layer 180 may include, for example, an acryl-based organic material or benzocyclobutene (BCB). In FIG. 1, the second insulating layer 180 is a single layer, but may include multiple layers in another embodiment.

The organic light-emitting device 200 may be on the second insulating layer 180. In one embodiment, the organic light-emitting device 200 includes the pixel electrode 210, an electrode 230 opposite to the pixel electrode 210, and an intermediate layer 220.

The second insulating layer 180 may include an opening which exposes at least one of the first electrode 162 or second electrode 160 of the TFT. The pixel electrode 210 contacts one of the first electrode 162 or the second electrode 160 through the opening, and is disposed on the second insulating layer 180.

The pixel electrode 210 may be, for example, a semi-transparent electrode or a reflective electrode. When the pixel electrode 210 is a semi-transparent electrode, the pixel electrode 210 may include, for example, indium tin oxide (ITO), indium zinc oxide (IZO), zinc oxide (ZnO), indium oxide ($In_2O_3$), indium gallium oxide (IGO), and/or aluminum zinc oxide (AZO).

When the pixel electrode 210 is a reflective electrode, the pixel electrode 210 may include a reflective layer which, for example, includes Ag, Mg, Al, Pt, Pd, Au, Ni, Nd, Ir, Cr, and/or a compound thereof, and/or a layer which includes ITO, IZO, ZnO, $In_2O_3$, IGO, or AZO. In another embodiment, pixel electrode 210 may include a different material. Also, the pixel electrode 210 may have a single-layer structure or a multiple-layer structure.

A third insulating layer 190 may be on the second insulating layer 180. The third insulating layer 190 may serve as a pixel-defining layer, and may include a plurality of openings, e.g., at least one of which defines an edge or surface of the pixel electrode 210 and which exposes at least a center of the pixel electrode 210. The openings may correspond to respective sub-pixels of a pixel.

Also, as illustrated in FIG. 1, the third insulating layer 190 may increase in thickness between at least one end of the pixel electrode 210 and the opposite electrode 230, to thereby prevent an arc from occurring at the end of the pixel electrode 210. The third insulating layer 190 may include, for example, an organic material such as but not limited to polyimide.

The intermediate layer 220 may include, for example, a low-molecular weight material or a polymer material. When the intermediate layer 220 includes a low-molecular weight material, the intermediate layer 220 may be formed by stacking a hole injection layer (HIL), a hole transport layer (HTL), an emission layer (EML), an electron transport layer (ETL), and an electron injection layer (EIL) in a single structure or a complex structure. The intermediate layer 220 may include, as an available organic material, copper phthalocyanine (CuPc), N,N'-Di(naphthalene-1-yl)-N,N'-diphenyl-benzidine (NPB), and/or tris-8-hydroxyquinoline aluminum (Alq3), or another material. The layers may be formed, for example, by vacuum evaporation or another method.

When the intermediate layer 220 includes a polymer material, the intermediate layer 220 may have a structure which includes an HTL and an EML. The HTL may include, for example, PEDOT and the EML may include, for example, a poly (p-phenylene vinylene) (PPV)-based polymer material and/or a polyfluorene-based polymer material. The HTL and the EML may be formed, for example, by screen printing, inkjet printing, or laser-induced thermal imaging (LITI), or another method. The intermediate layer 220 may have a structure different from that shown in FIG. 1 in another embodiment.

The electrode 230 opposes the pixel electrode 210, with layer 220 (including the EML) therebetween. The opposite electrode 230 may be disposed completely or partially over the substrate 100. In one embodiment, the opposite electrode 230 is formed as one complete body corresponding to the pixel electrode 210.

The opposite electrode 230 may be, for example, a semi-transparent electrode or a reflective electrode. When the opposite electrode 230 is a semi-transparent electrode, the opposite electrode 230 may include a layer formed of metal (e.g., Li, Ca, LiF/Ca, LiF/Al, Al, Ag, Mg, and/or a compound thereof) having a small work function and a semi-transparent conductive layer formed, for example, of ITO, IZO, ZnO, or $In_2O_3$.

When the opposite electrode 230 is a reflective electrode, the opposite electrode 230 may include a layer formed, for example, of Li, Ca, LiF/Ca, LiF/Al, Al, Ag, Mg, and/or a compound thereof. The opposite electrode 230 may have a different structure and/or may be made from a different material in another embodiment.

As described above, the first protective layer 170 in the organic light emitting display apparatus of FIG. 1 prevents a short circuit from occurring between the first and second electrodes 162 and 160 of the TFT. Moreover, a short circuit is prevented from occurring if the pixel electrode 210 is pressed down toward the first electrode 162 of the TFT due to the foreign material D (see FIGS. 2 and 3) penetrating into the device. When the pixel electrode 210 is pressed down by the foreign material D, the layer 180 may be deformed to allow the pixel electrode 210 to move into the space between the transistor and the pixel electrode 210. The first protective layer 170 may include an inorganic or organic material that is non-conductive. Because using an organic material that is non-conductive incurs high costs, forming the first protective layer 170 from an inorganic material within a minimum or predetermined thickness range may reduce manufacturing costs considerably.

Figure 2:
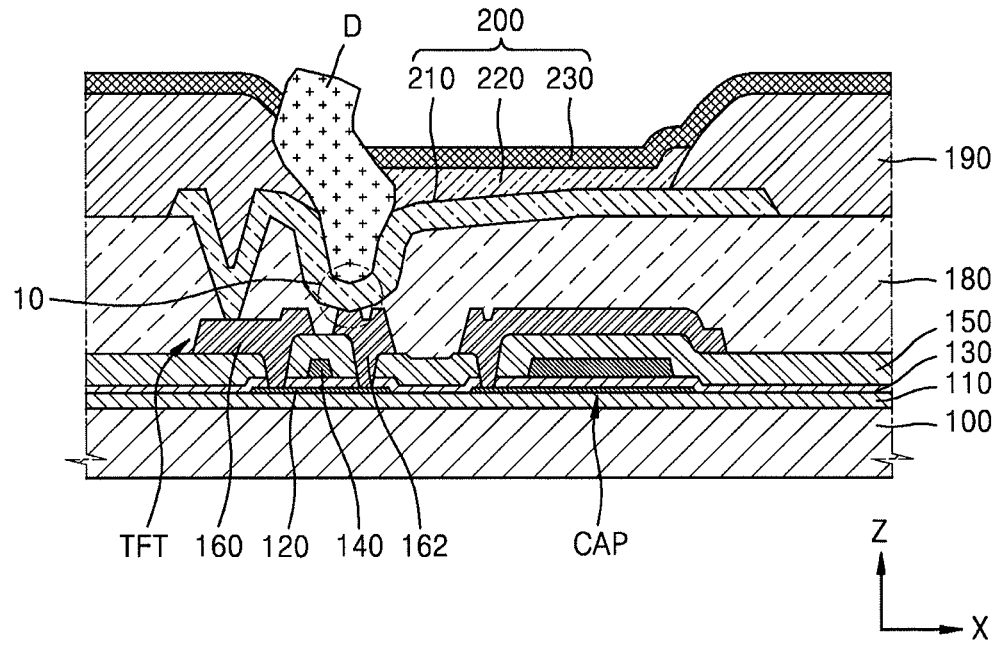
FIG. 2 illustrates an example of a foreign material that has penetrated into an organic light-emitting display having no protective layer.
Figure 3:
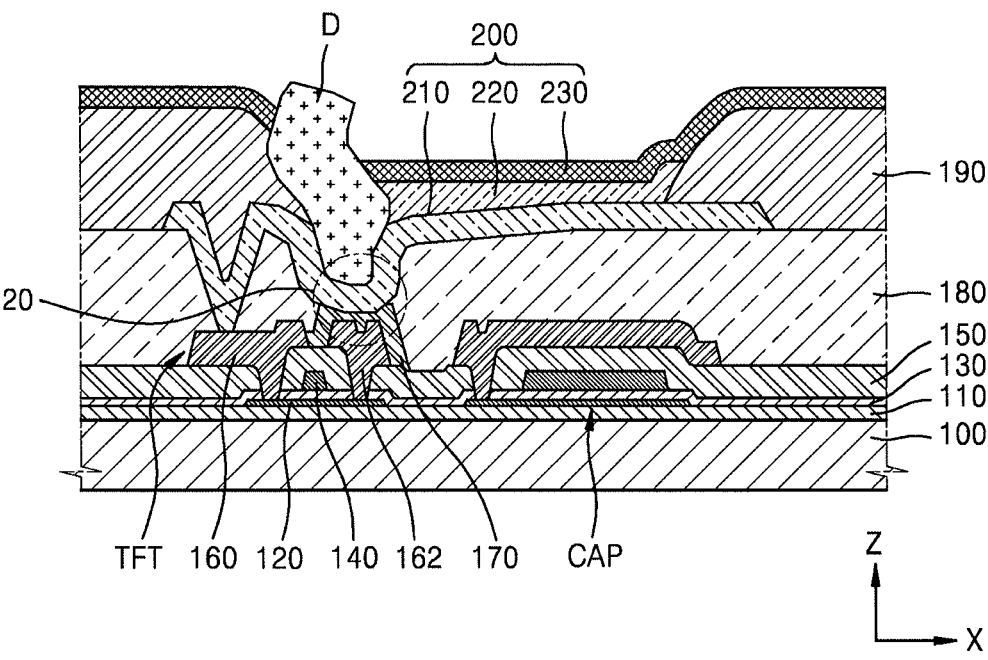
FIG. 3 illustrates an example of a foreign material that has penetrated into the organic light-emitting display of FIG. 1.

FIG. 2 illustrates a case where a foreign material D penetrates into an organic light-emitting display apparatus which does not have a protective layer. FIG. 3 illustrates the protection afforded by the protective layer (e.g., the first protective layer 170) in the device of FIG. 1.

Referring to FIG. 2, when the first protective layer 170 is not included, the second insulating layer 180 is disposed directly on the TFT. Because the second insulating layer 180 is formed of an organic material as described above, the second insulating layer 180 is vulnerable to being deformed when a foreign material penetrates into the device. When the foreign material D penetrates into the display unit, the pixel electrode 210 may contact the opposite electrode 230 due to the foreign material D. A defect may therefore occur in the form of a dark spot.

However, as illustrated in FIG. 2, when the foreign material D deeply penetrates into the display unit, a contact portion (area 10) occurs between the pixel electrode 210 and the first electrode 162, corresponding to the data line, of the TFT. As a result, a defect caused by a bright spot occurs in the pixel. Some of pixels in which the dark spot defect occurs may be determined as good pixels depending on visibility. However, all pixels in which a bright spot defect occurs may be considered to be defective pixels, which has an adverse effect on total yield rate.

Also, a case may occur in which therefore is a dark spot at an initial stage of manufacture which is changed to a bright spot, as a result of penetration of the foreign material D. This case may be described as a progressive defect, which, for example, may occur after a product is released.

In order to prevent a bright spot defect from occurring in a pixel, the first protective layer 170 may be disposed on the first electrode 162 as illustrated in FIG. 1. As illustrated in FIG. 3, the first protective layer 170 serves to protect the device when the foreign material D deeply penetrates into the display unit. For example, the first protective layer 170 prevents the pixel electrode 210 from directly contacting the first electrode 162 of the TFT at a contact portion (area 20) between the pixel electrode 210 and the TFT. The first protective layer 170, therefore, prevents a short circuit from forming, and therefore has the effect of considerably decreasing the formation of bright spot defects in a pixel.

Figure 4:
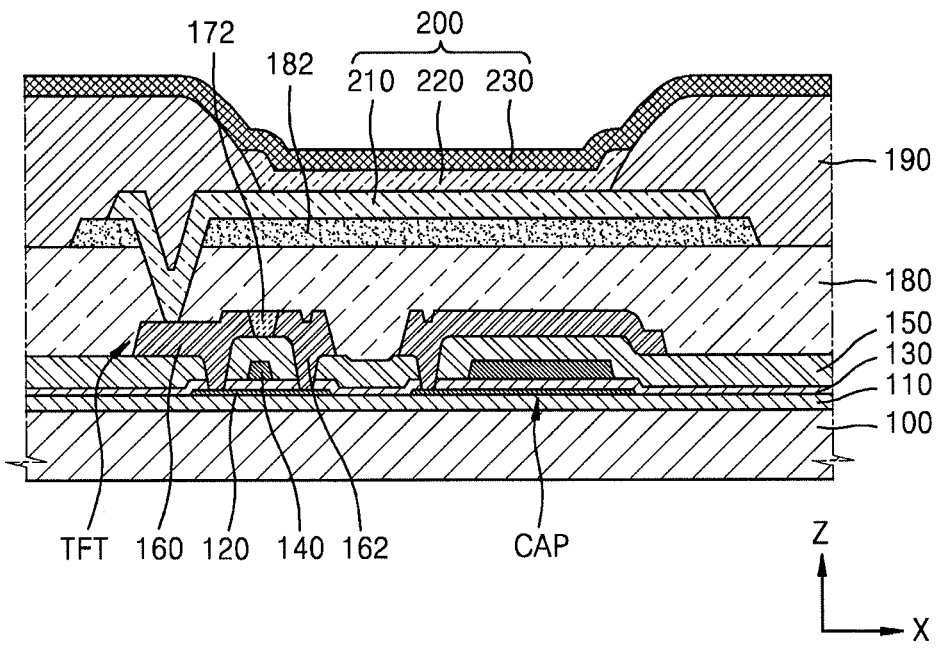
FIG. 4 illustrates another embodiment of an organic light-emitting display.

FIG. 4 illustrates another embodiment of an organic light-emitting display apparatus which includes a substrate 100, a TFT on the substrate 100, a first protective layer 172, a second protective layer 182, and an organic light-emitting device 200. The substrate 100, the transistor TFT, the first protective layer 172, the second protective layer 182, and the organic light-emitting device 200 may all correspond to a pixel, which may be a unit pixel or sub-pixel. A capacitor CAP is electrically connected to the transistor TFT. The capacitor may store a voltage corresponding, for example, to a gray scale value of light to be emitted from the pixel or sub-pixel.

The first protective layer 172 is on a first insulating layer 150, which serves as an interlayer insulating layer. The first protective layer 172 is also on the gate electrode 140 of the TFT. At least a portion of one end of the first protective layer 172 contacts a first electrode 162, and at least a portion of another end of the first protective layer 172 contacts second electrode 160. That is, the first and second electrodes 162 and 160 are spaced from one another certain interval, and the first protective layer 172 may be disposed in the space between the first and second electrodes 162 and 160. The first protective layer 172, therefore, serves to prevent a short circuit from occurring due to direct contact between the first and second electrodes 162 and 160 of the TFT.

The second protective layer 182 is between a second insulating layer 180 and the pixel electrode 210. The second protective layer 182 may be over at least the first electrode 162 of the TFT. Because the second protective layer 182 is over the first electrode 162, when the foreign material D deeply penetrates into the display unit, the second protective layer 182 prevents the pixel electrode 210 from contacting the first electrode 162. The second protective layer 182 may therefore prevent short circuits from occurring as a result of direct contact between the pixel electrode 210 and the first electrode 162, and thus may prevent a bright spot defect from occurring in a pixel.

The first and second protective layers 172 and 182 may include, for example, silicon oxide, silicon nitride, and/or silicon oxynitride. Because organic materials are expensive to use, in one embodiment the first and second protective layers 172 and 182 may include inorganic material disposed to have a predetermined or a minimum range thickness, to thereby reduce manufacturing costs. In another embodiment, the first and second protective layers may be made from an organic material.

FIG. 5 illustrates operations included in one embodiment of a method for manufacturing an organic light-emitting display apparatus, which, for example, may correspond to the apparatus of FIG. 1. For illustrative purposes only, the operations of the method will be discussed relative to the apparatus in FIG. 1.

Referring to FIG. 5, the method includes forming the TFT on the substrate 100. This operation includes forming the buffer layer 110 on the substrate 100 (S505), and then performing a patterning operation to form the semiconductor layer 120 on the buffer layer 110 (S510).

After the semiconductor layer 120 is formed, a process of stacking the gate insulating layer 130 on the semiconductor layer 120 (S515), and performing a patterning operation to form the gate electrode 140 on the gate insulating layer 130 (S520). The method also includes patterning the first insulating layer 150 over the gate insulating layer 130 and the gate electrode 140 (S525), and forming the first electrode 162 corresponding to the source electrode and the second electrode 160 corresponding to the drain electrode over portions of the first insulating layer 150, at respective sides of the gate electrode 140 (S530). The first and second electrodes 162 and 160 may be formed as patterns that extend through the gate insulating layer 130 to electrically contact the semiconductor layer 120.

Subsequently, a process of stacking the first protective layer 170 and the second insulating layer 180 over the TFT is performed (S535). The first protective layer 170 may protects the TFT as previously explained. The second insulating layer 180 may protect the TFT and/or planarize the top surface of the TFT. In an alternative embodiment, only one of the first protective layer 170 or the second insulating layer 180 may be formed to protect the TFT.

Also, the first protective layer 170 may be formed over only one of the drain electrode, source electrode, or drain electrode, or over two or all of these electrodes. The first protective layer 170 may be formed directly on one or more electrodes of the TFT, or one or more intervening layers may be situated between the one or more TFT electrodes and the first protective layer 170.

The method may further include forming a contact hole through the second insulating layer 180 to expose one of the source or drain electrodes (S540). Then, the method includes forming the pixel electrode 210 over the second insulating layer 180, to be electrically connected to one of the first or second electrodes 162 and 160 of the TFT (S545). In one embodiment, the pixel electrode 210 is electrically connected to the drain electrode 160. In an alternative embodiment, the pixel electrode 210 is electrically connected to the source electrode 162.

The method further includes forming the third insulating layer 190 in a pattern on the pixel electrode 210 (S550). The third insulating layer 190 may serve as a pixel-defining layer to define a pixel. The third insulating layer 190 may be patterned to cover respective edges of the pixel electrode 210, while leaving a predetermined (e.g., central) portion of the pixel electrode 210 is exposed.

The method further includes forming the intermediate layer 220 (including the EML) on the predetermined portion of the pixel electrode 210 that is exposed by the third insulating layer 190 (S555). Subsequently, a process of forming the opposite electrode 230 corresponding to the pixel electrode 210 is performed (S560). For example, as illustrated in FIG. 5, the opposite electrode 230 may be formed all over the third insulating layer 190.

By way of summation and review, when an electrode of an organic light-emitting device contacts at least one electrode of the TFT, a dark spot or bright spot may occur. The dark or bright spot may occur when a foreign material penetrates into one of the electrodes of the light-emitting device. When this happens, the quality of the display is adversely affected. In accordance with one or more of the aforementioned embodiments, an organic light-emitting display apparatus includes at least one protective layer to prevent a pixel driving error from occurring due to penetration of a foreign material.

In at least one embodiment, an organic light-emitting display apparatus which includes a transistor, at least one protective layer over a first electrode of the transistor, and an organic light-emitting device having a pixel electrode electrically connected to a second electrode of the transistor. The at least one protective layer extends between the first and second electrodes, and prevents an electrical short from forming between the pixel electrode and one of the transistor electrodes when a foreign object applies a force which moves the pixel electrode towards the transistor. Two protective layers that are spaced from one another may also prevent this type of electrical short.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
   a substrate;
   a transistor on the substrate, the transistor including a gate electrode, a first electrode, and a second electrode;
   a first insulating layer between the gate electrode and the first and second electrodes;
   a first protective layer on the first insulating layer on the gate electrode, a first portion of the first protective layer directly contacting the first electrode and a second portion of the first protective layer directly contacting the second electrode;
   an organic light-emitting device having a pixel electrode electrically connected to the second electrode and an emission layer on the pixel electrode;
   a second insulating layer between the transistor and the pixel electrode; and
   a second protective layer between the second insulating layer and the pixel electrode, the second protective layer including an inorganic material,
   wherein a top surface of the first protective layer is co-planar with a top surface of at least one of the first electrode and the second electrode, and
   the second insulating layer is thicker than the first protective layer and the second protective layer, and
   wherein the pixel electrode is directly connected to the second electrode through a contact hole included in the second insulating layer, and an entire portion of the second protective layer is separated from the second electrode.

2. The apparatus as claimed in claim 1, wherein the second protective layer is on the first electrode.

3. The apparatus as claimed in claim 1, wherein the first protective layer includes an inorganic material.

4. The apparatus as claimed in claim 1, wherein the first protective layer and the second insulating layer are made of different materials from each other.

5. The apparatus as claimed in claim 1, further comprising a pixel-defining layer on the second protective layer that includes an opening so as to expose at least a center of the pixel electrode.

6. The apparatus as claimed in claim 1, wherein the first insulating layer is in direct contact with the second insulating layer in at least some regions that do not overlap the first electrode.

7. The apparatus as claimed in claim 1, wherein the second insulating layer is a planarization layer that planarizes a top surface of the transistor so as to cause that portion of the pixel electrode in contact with the emission layer to be flat.

8. The apparatus as claimed in claim 1, wherein
   each of the first protective layer and the second protective layer is integrally formed,
   the first protective layer is spaced apart from the second protective layer,
   the first protective layer includes an inorganic material,
   the top surface of the first protective layer is co-planar with the top surface of both the first electrode and second electrode, and
   the second protective layer includes the inorganic material.

9. The apparatus as claimed in claim 1, wherein when force is applied to the pixel electrode of the light emitter in a direction towards a space defined at least in part by the second insulating layer, the second protective layer contacts the pixel electrode of the light emitter so as to block the first electrode of the transistor from being electrically connected to the pixel electrode of the light emitter.

10. A pixel, comprising:
   a substrate;
   a transistor on the substrate;
   a planarization layer on and over the transistor;
   a light emitter that includes a pixel electrode and is disposed on the planarization layer, a portion of the pixel electrode disposed in a direction parallel to a main surface of the substrate, the portion of the pixel electrode being spaced apart from the transistor by a space defined at least in part by the planarization layer, and an emission layer disposed on the pixel electrode; and
   at least one protective layer including a protective layer that includes a non-conductive material, the protective layer being directly disposed on the planarization layer, and being disposed between the planarization layer and the light emitter, the at least one protective layer further including another protective layer that extends only between source and drain electrodes of the transistor as seen in a side view, wherein
   the protective layer includes an inorganic material, and
   when force is applied to the pixel electrode of the light emitter in a direction towards the space, the protective layer contacts the pixel electrode of the light emitter so as to block the source electrode of the transistor from being electrically connected to the source electrode of the transistor via the pixel electrode of the light emitter.

11. The pixel as claimed in claim 10, wherein
   the protective layer is over a number of electrodes of the transistor, and
   the number is less than three.

12. The pixel as claimed in claim 10, wherein the planarization layer is disposed over the another protective layer.

13. The pixel as claimed in claim 10, wherein the another protective layer is directly between source and drain electrodes of the transistor, and the protective layer is spaced from the another protective layer over the transistor.

14. The pixel as claimed in claim 13, wherein the protective layer is between the another protective layer and the pixel electrode of the light emitter.

15. An organic light-emitting display apparatus, comprising:

a substrate;

a transistor on the substrate and including a gate electrode, a first electrode, and a second electrode, the first electrode and the second electrode including a metal;

a first protective layer made of an insulating material that directly contacts the second electrode and is disposed only in a region between the first electrode and the second electrode as seen in a side view with a top surface of the first protective layer extending as high as a top surface of at least one of the first electrode and the second electrode;

a second protective layer over the first electrode;

a second insulating layer disposed between the first protective layer and the second protective layer; and an organic light-emitting device having a pixel electrode electrically connected to the second electrode and an emission layer on the pixel electrode, wherein the pixel electrode is directly connected to the second electrode through a contact hole included in the second insulating layer, and an entire portion of the second protective layer is separated from the second electrode.

16. The apparatus as claimed in claim 15, further comprising:

an insulating layer between the gate electrode and the first and second electrodes, wherein the first protective layer directly contacts the insulating layer.

17. The apparatus as claimed in claim 16, wherein the first protective layer is disposed only in a region directly above where the transistor is disposed.

18. The apparatus as claimed in claim 15, wherein the first protective layer includes an inorganic material.

19. The apparatus as claimed in claim 15, further comprising a pixel-defining layer on the second protective layer that includes an opening so as to expose at least a center of the pixel electrode.

20. The apparatus as claimed in claim 15, wherein the first protective layer is spaced apart from the second protective layer, the first protective layer includes an inorganic material, the top surface of the first protective layer is co-planar with a top surface of both the first electrode and the second electrode, and the second protective layer includes an inorganic material.

* * * * *